US008309413B2

(12) United States Patent
Benson

(10) Patent No.: US 8,309,413 B2
(45) Date of Patent: Nov. 13, 2012

(54) METHODS OF FORMING CAPACITORS

(75) Inventor: Russell A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/225,034

(22) Filed: Sep. 2, 2011

(65) Prior Publication Data

US 2011/0318899 A1 Dec. 29, 2011

Related U.S. Application Data

(63) Continuation of application No. 11/631,664, filed on Aug. 20, 2008, which is a continuation of application No. 11/638,223, filed on Dec. 11, 2006, now Pat. No. 7,648,872.

(51) Int. Cl.
H01L 21/8242 (2006.01)
(52) U.S. Cl. ............... 438/239; 438/723; 257/E21.035
(58) Field of Classification Search ............. 438/239, 438/723; 257/E21.035
See application file for complete search history.

(56) References Cited

U.S. PATENT DOCUMENTS

| 4,028,155 | A | 6/1977 | Jacob |
| 6,620,737 | B2 | 9/2003 | Sainto et al. |
| 7,175,966 | B2 * | 2/2007 | Babich et al. ............. 430/271.1 |
| 7,256,120 | B2 | 8/2007 | Tsao et al. |
| 7,335,611 | B2 | 2/2008 | Ramaswamy et al. |
| 7,344,996 | B1 | 3/2008 | Lang et al. |
| 2003/0148581 | A1 | 8/2003 | Kim et al. |
| 2003/0148858 | A1 | 8/2003 | Jones |
| 2006/0134921 | A1 | 6/2006 | Wu et al. |
| 2007/0131652 | A1 | 6/2007 | Okune et al. |
| 2007/0197033 | A1 | 8/2007 | Wilson |

FOREIGN PATENT DOCUMENTS

| EP | 0596593 | 5/1994 |
| EP | 1498941 | 1/2005 |
| JP | 2000-223478 | 8/2000 |
| WO | PCT/US2007/023391 | 4/2008 |
| WO | PCT/US2007/023391 | 6/2009 |

* cited by examiner

Primary Examiner — William D Coleman
(74) Attorney, Agent, or Firm — Wells St. John P.S.

(57) ABSTRACT

Methods of etching into silicon oxide-containing material with an etching ambient having at least 75 volume percent helium. The etching ambient may also include carbon monoxide, $O_2$ and one or more fluorocarbons. The openings formed in the silicon oxide-containing material may be utilized for fabrication of container capacitors, and such capacitors may be incorporated into DRAM.

8 Claims, 8 Drawing Sheets

METHODS OF FORMING CAPACITORS

RELATED PATENT DATA

This patent resulted from a continuation of U.S. patent application Ser. No. 11/631,664, which was filed Dec. 4, 2009, and which is hereby incorporated herein by reference; which resulted from a continuation of U.S. patent application Ser. No. 11/638,223, which was filed Dec. 11, 2006, which is now U.S. Pat. No. 7,648,872, and which is hereby incorporated herein by reference.

TECHNICAL FIELD

Methods of etching into silicon oxide-containing material, methods of forming container capacitors, and methods of forming DRAM arrays.

BACKGROUND

Semiconductor processing may frequently include an etch into or through silicon oxide-containing material. The silicon oxide-containing material may be undoped (and thus may consist of silicon dioxide ($SiO_2$)), or may be doped (and thus may comprise, for example, one or more of borophosphosilicate glass (BPSG), phosphosilicate glass (PSG), and fluorosilicate glass (FSG)).

An example application in which silicon oxide-containing material is etched is the formation of capacitor container openings. FIGS. 1-3 illustrate a conventional method for forming capacitor container openings within silicon oxide-containing material.

Referring to FIG. 1, such shows a semiconductor construction 10 at a preliminary processing stage. Construction 10 comprises a base semiconductor material 12 having a plurality of transistors 14, 16 and 18 supported thereby. The base semiconductor material may comprise any suitable semiconductor composition or combination of compositions; and may, for example, comprise, consist essentially of or consist of monocrystalline silicon lightly background doped with appropriate dopant. The base may be a portion of a monocrystalline silicon wafer.

The base 12 may be considered to be a semiconductor substrate, or a portion of a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistors 14, 16 and 18 comprise gates 24, 26 and 28, respectively. Such gates include stacks comprising gate dielectric 30, electrically conductive gate material 32, and an electrically insulative cap 34. The electrically conductive gate material may comprise one or more of metal (such as titanium or tungsten), metal compounds (for instance, metal silicide or metal nitride), and conductively-doped semiconductor material (for instance, conductively-doped silicon). The gate dielectric may comprise silicon dioxide. The insulative caps may comprise one or more of silicon nitride, silicon dioxide and silicon oxynitride.

Electrically insulative sidewall spacers 36 are along sidewalls of the gates. Such sidewall spacers may one or more of silicon dioxide, silicon nitride and silicon oxynitride.

Transistors 14, 16 and 18 comprise source/drain regions 40, 42, 44, 46 and 48. Transistors 14 and 16 are paired, and share a common source/drain region 42. Transistor 18 may be part of another paired transistor set, so that source/drain region 48 is also a shared source/drain region. Source/drain regions 44 and 46 are electrically isolated from one another by an isolation region 45 provided between them. The isolation region is filled with insulative material, such as, for example, one or both of silicon dioxide and silicon nitride; and may correspond to a shallow trench isolation region.

Ultimately, shared source/drain regions 42 and 48 may be connected to bitlines, and the remaining source/drain regions 40, 44 and 46 may be connected to capacitors. Accordingly, transistors 14, 16 and 18 may be incorporated into a dynamic random access memory (DRAM) array.

A silicon oxide-containing material 50 is over transistors 14, 16 and 18. The silicon oxide-containing material may comprise a single homogeneous mass as shown, or may comprise multiple layers. A majority of the silicon oxide-containing material may consist of one or more of doped oxides, such as BPSG, PSG or FSG; and in some applications an entirety of the silicon oxide-containing material 50 may consist of one or more doped oxides. In some applications, at least a portion of silicon oxide-containing material 50 may consist of silicon dioxide. For instance, a lower portion of silicon oxide-containing material 50 may be a layer of silicon dioxide, and the remainder of silicon oxide-containing material 50 may be one or more doped oxides.

A patterned mask 52 is formed over material 50. The patterned mask has a plurality of openings 54, 56 and 58 extending therethrough. The patterned mask may comprise, consist essentially of or consist of carbon-containing material, such as transparent carbon, amorphous carbon and/or photoresist.

Referring to FIG. 2, openings 54, 56 and 58 are extended through silicon oxide-containing material 50 to source/drain regions 40, 44 and 46, respectively. The openings may be extended through the silicon oxide-containing material with an etch utilizing $C_4F_8$ (flowed at about 60 standard cubic centimeters per minute (sccm)), argon (flowed at about 1100 sccm), oxygen (flowed at about 25 sccm) and $C_4F_6$ (flowed at about 2 sccm). Such etch may be conducted under a pressure of about 30 millitorr, utilizing a plasma power of about 2100 watts at about 60 megahertz, and a substrate bias of about 3500 watts at about 2 megahertz.

A problem with an etch as described above is that it may create the shown bowing within openings 56 and 58, which creates widened regions 60 and 62. Such widened regions thin a sidewall between them so that openings 56 and 68 touch or nearly touch at a location 63. Also, the etch may lead to so-called "twisting" within the openings such that the internal periphery of the openings appears to twist along the vertical length of the openings.

Referring to FIG. 3, masking material 52 (FIG. 2) is removed and capacitor materials 70, 72 and 74 are formed within the openings 54, 56 and 58. Capacitor material 70 is a first electrode material, capacitor material 72 is a dielectric material, and capacitor material 74 is a second electrode material. Materials 70 and 74 are electrically conductive, and may comprise one or more of metal, metal compounds, and conductively-doped semiconductor materials. Material 72 is electrically insulative, and may comprise one or more of silicon dioxide, silicon nitride, and various high-k materials.

Materials 70, 72 and 74 are intended to form capacitor constructions 80, 82 and 84 within openings 54, 56 and 58. Unfortunately, the bowing within openings 56 and 58 may cause capacitors 82 and 84 to be shorted to one another.

DETAILED DESCRIPTION

Embodiments of the invention may utilize new etching chemistries to avoid bowing and other problems associated with formation of high aspect ratio openings using conventional processing. Openings formed with such new etching chemistries may be utilized for fabrication of container capacitors, and such capacitors may be incorporated into DRAM.

Figure 1:
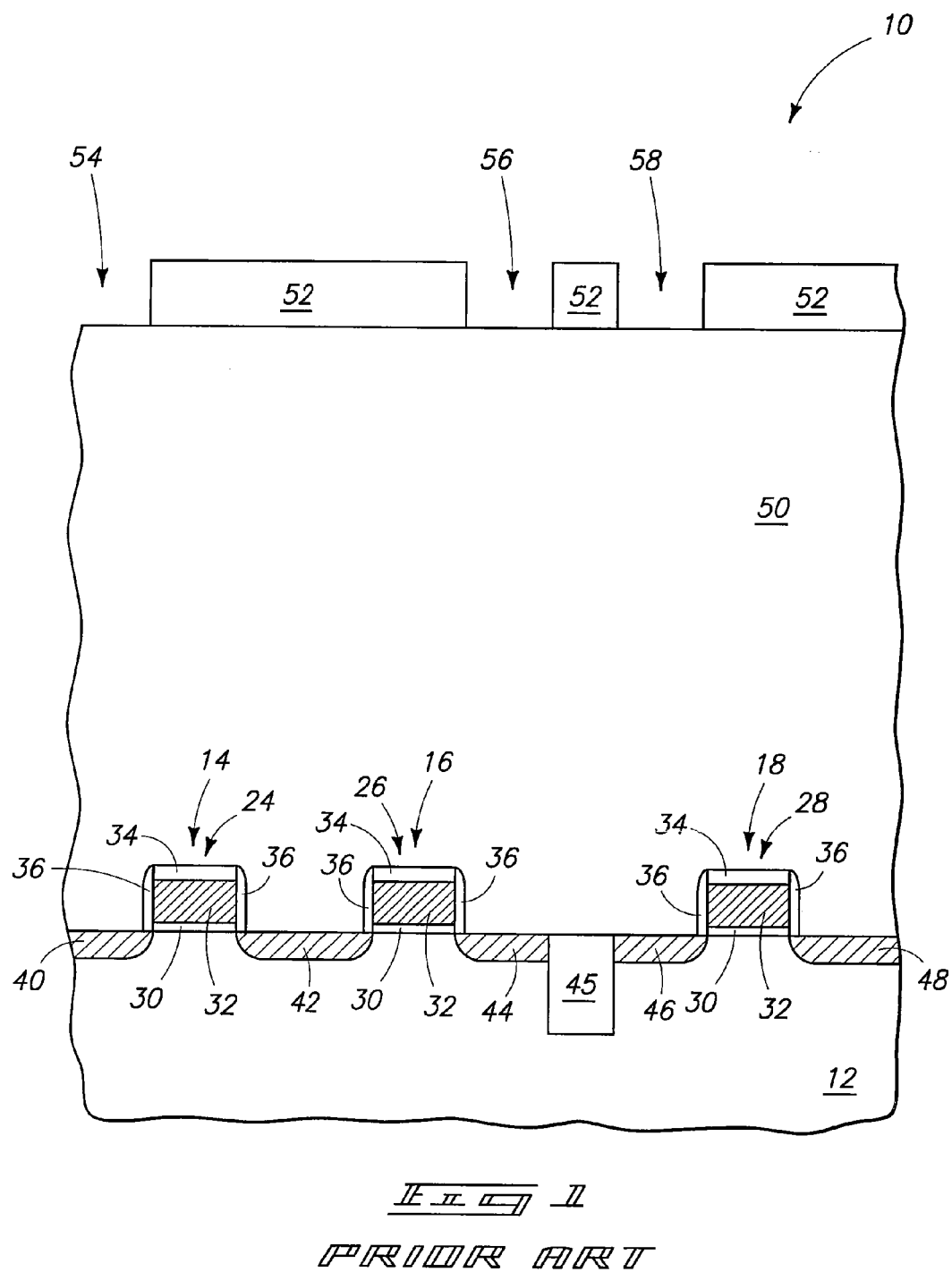
FIGS. 1-3 illustrate semiconductor wafer fragments at various conventional processing stages for forming capacitors of a DRAM array.
Figure 2:
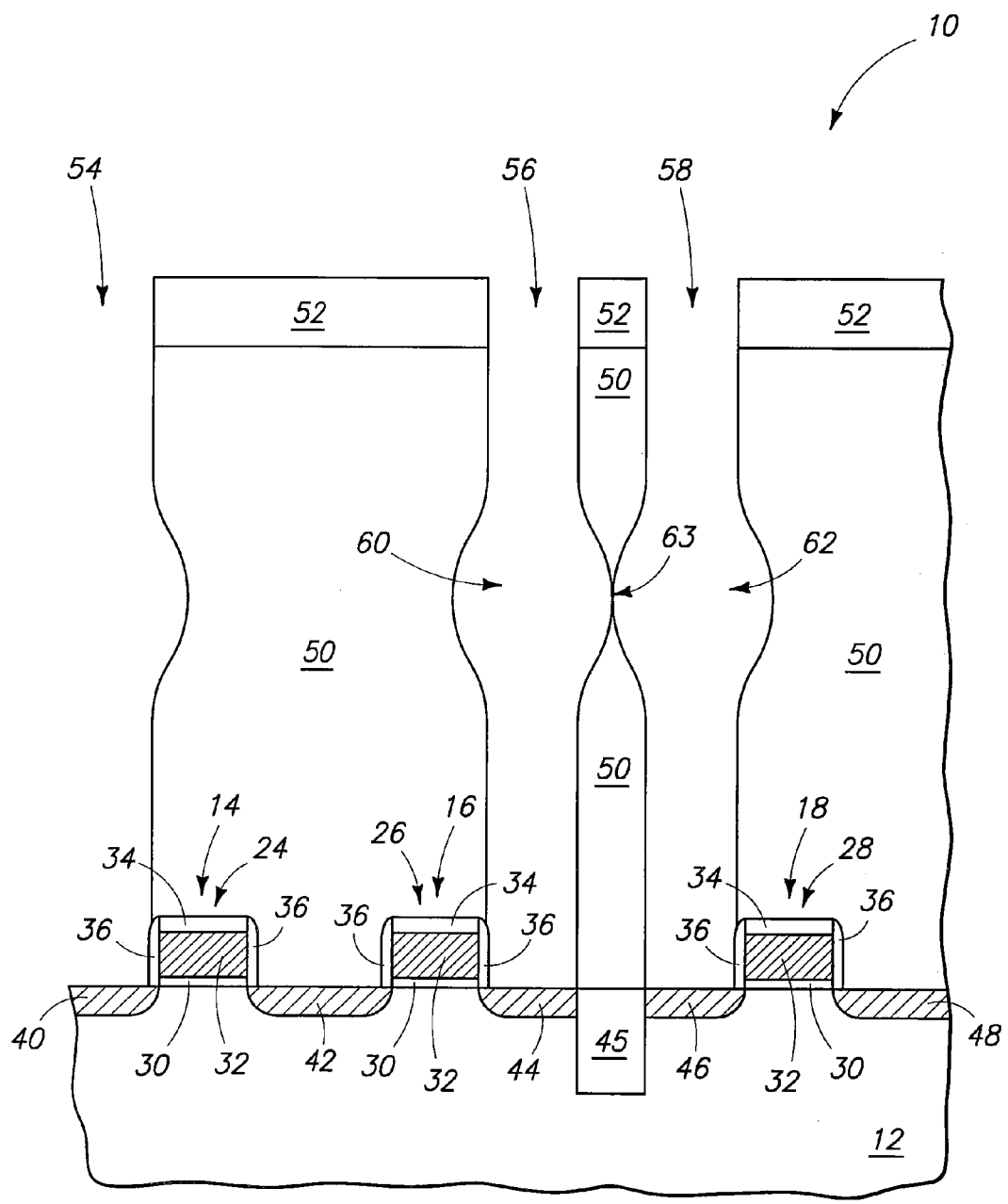
Figure 3:
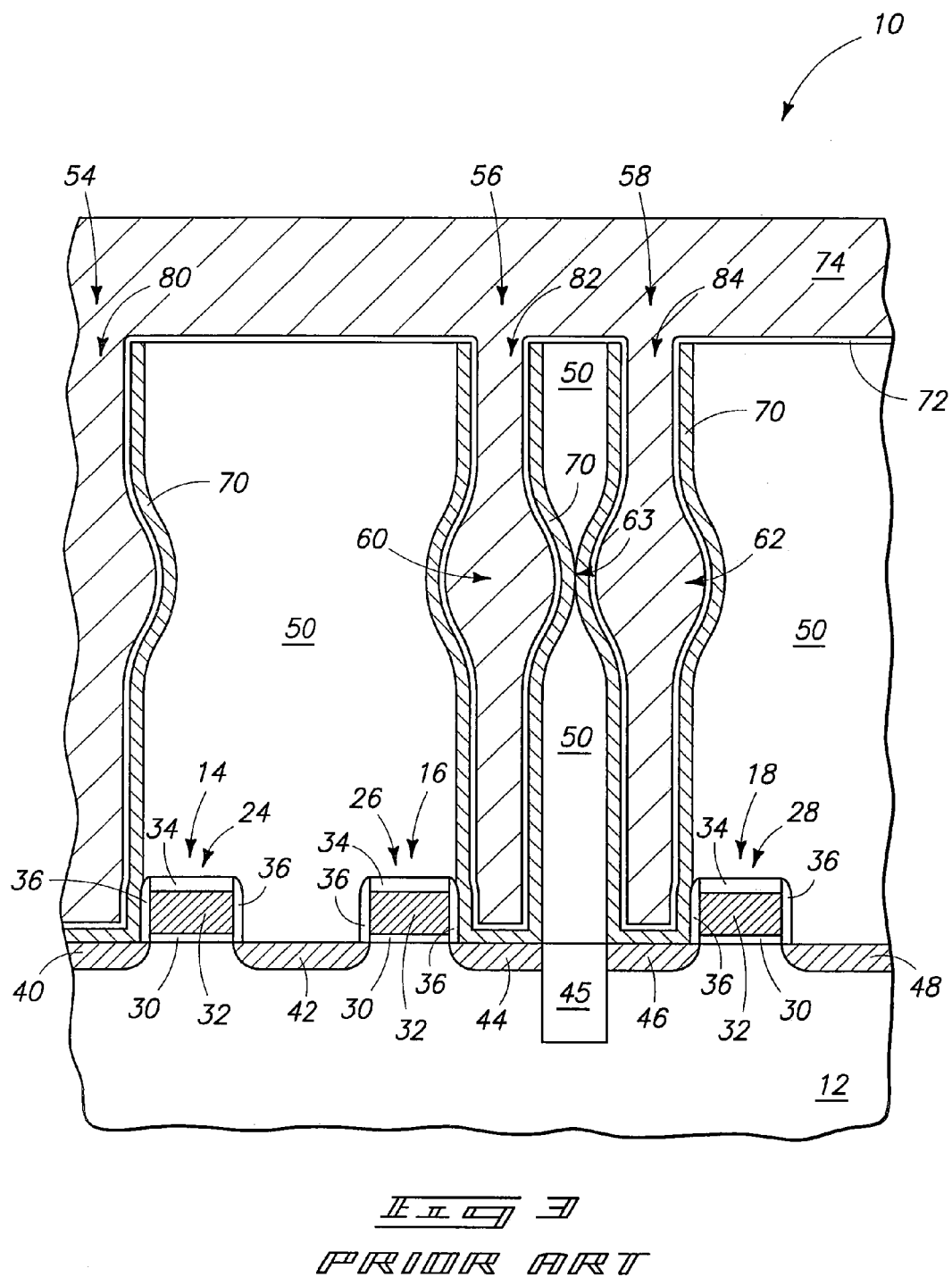

FIGS. 4-7 illustrate an embodiment of the invention. In referring to FIGS. 4-7, similar numbering will be used as was utilized in describing the conventional process of FIGS. 1-3, where appropriate.

Figure 4:
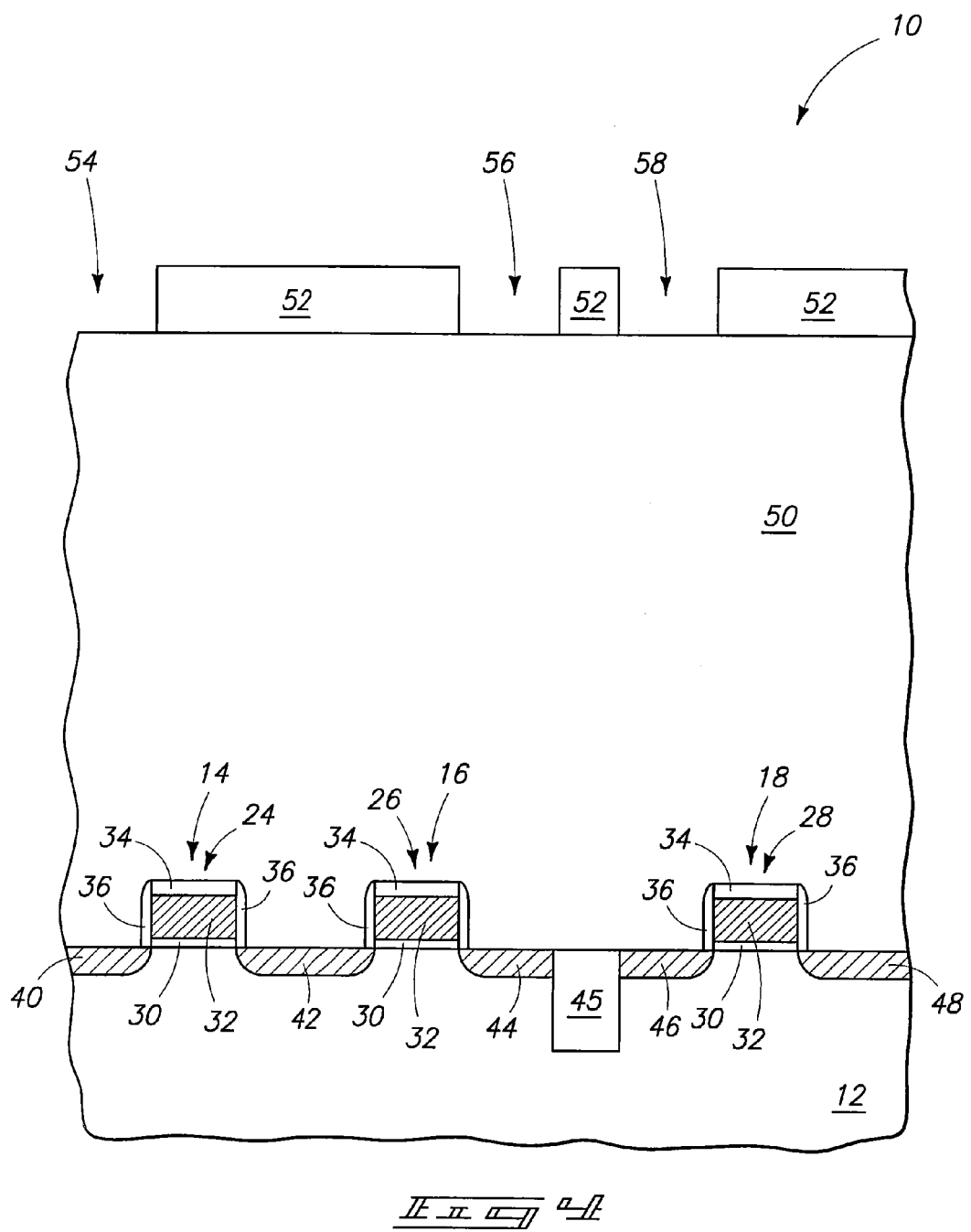
FIGS. 4-7 illustrate semiconductor wafer fragments at various processing stages in accordance with an embodiment of the invention for forming openings through a silicon oxide-containing material, and for forming capacitors within such openings.

Referring initially to FIG. 4, such shows a semiconductor construction 10 similar to that discussed above with reference to FIG. 1. The construction 10 of FIG. 4 comprises the semiconductor base 12, transistors 14, 16 and 18, isolation region 45, silicon oxide-containing material 50, and patterned masking material 52 discussed above with reference to FIG. 1.

Gaps (or openings) 54, 56 and 58 extend through patterned masking material 52. A difference between the construction of FIG. 4 and that of FIG. 1 may be that gaps 54, 56 and 58 have different dimensions in FIG. 4 than in FIG. 1. Such difference in dimensions may be used to optimize the construction of FIG. 4 for different etching conditions than the conventional conditions utilized to treat the construction of FIG. 1.

Figure 5:
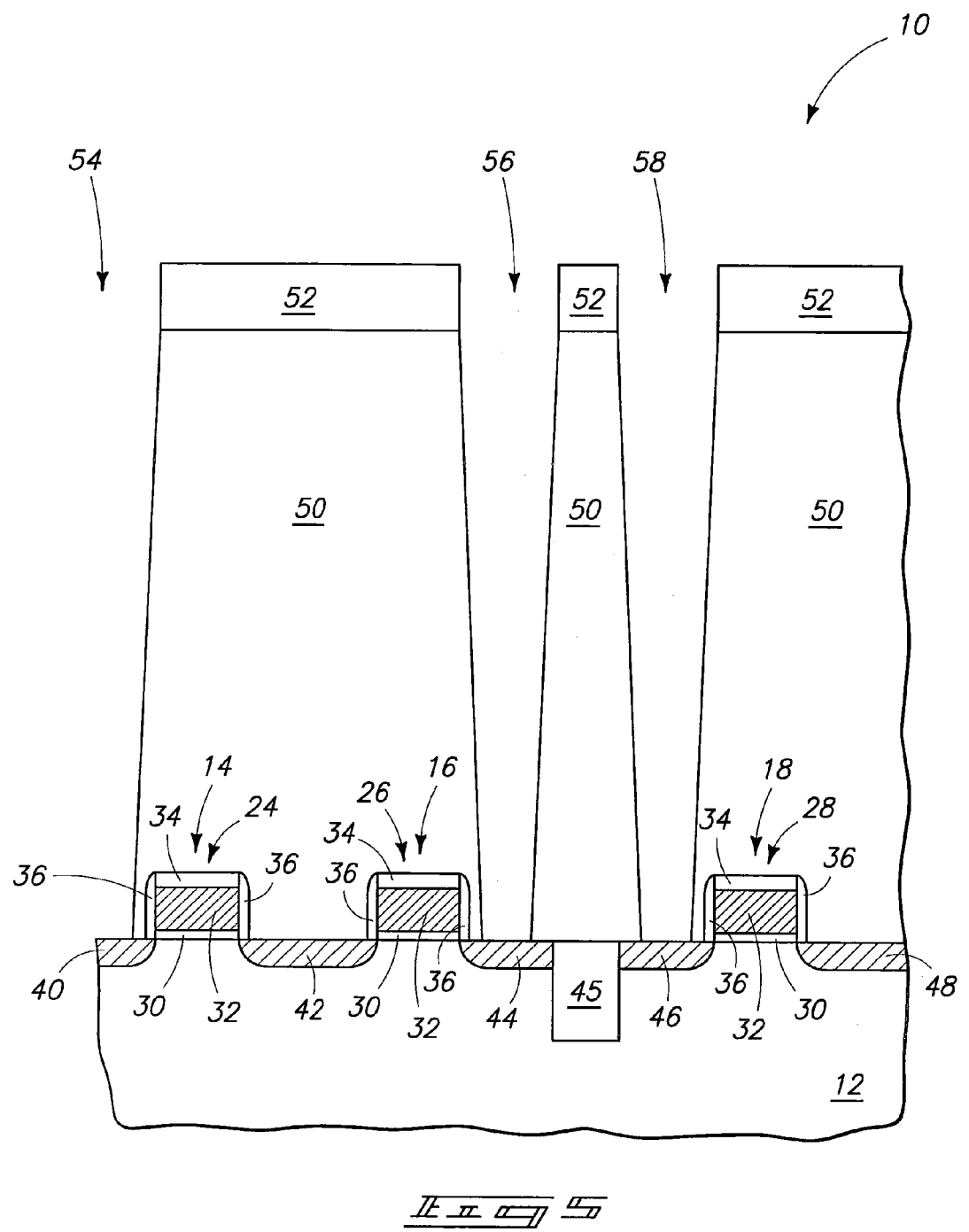

Referring to FIG. 5, construction 10 is subjected to an etch which extends openings 54, 56 and 58 through silicon oxide-containing material to source/drain regions 40, 44 and 46, respectively. The etch forms the openings within silicon oxide-containing material 50 to be more tapered than the openings formed by the conventional etching conditions (the openings of FIG. 2), and also avoids problems associated with bowing and twisting. In some embodiments, bowing and twisting may be eliminated. Even if the bowing and twisting are not eliminated, the tapering of the openings may create additional spacing between the openings as the openings penetrate deeper into silicon oxide-containing material 50, which may avoid overlap of adjacent openings. In some embodiments, etching conditions may be chosen such that the tapering is lessened relative to that shown in FIG. 5; and in some embodiments the etching conditions may form sidewalls that are about as vertical as those formed by conventional processes.

The etch utilized to extend openings 54, 56 and 58 through silicon oxide-containing material 50 may be a plasma etch utilizing a high concentration of helium. A plasma etch may have a chemical-based part and a physical-based part. The chemical-based part of the etch is due to chemical interaction of etching components with material to cause a reaction which removes the material. The physical-based part of the etch is due to impact of energetic etch components into the material to displace portions the material (in some ways analogous to sand-blasting). Helium is a lighter element than the argon utilized in the conventional processing of FIGS. 1-3, and this may cause the physical etch component associate with helium to be less than that associated with argon.

Figure 8:
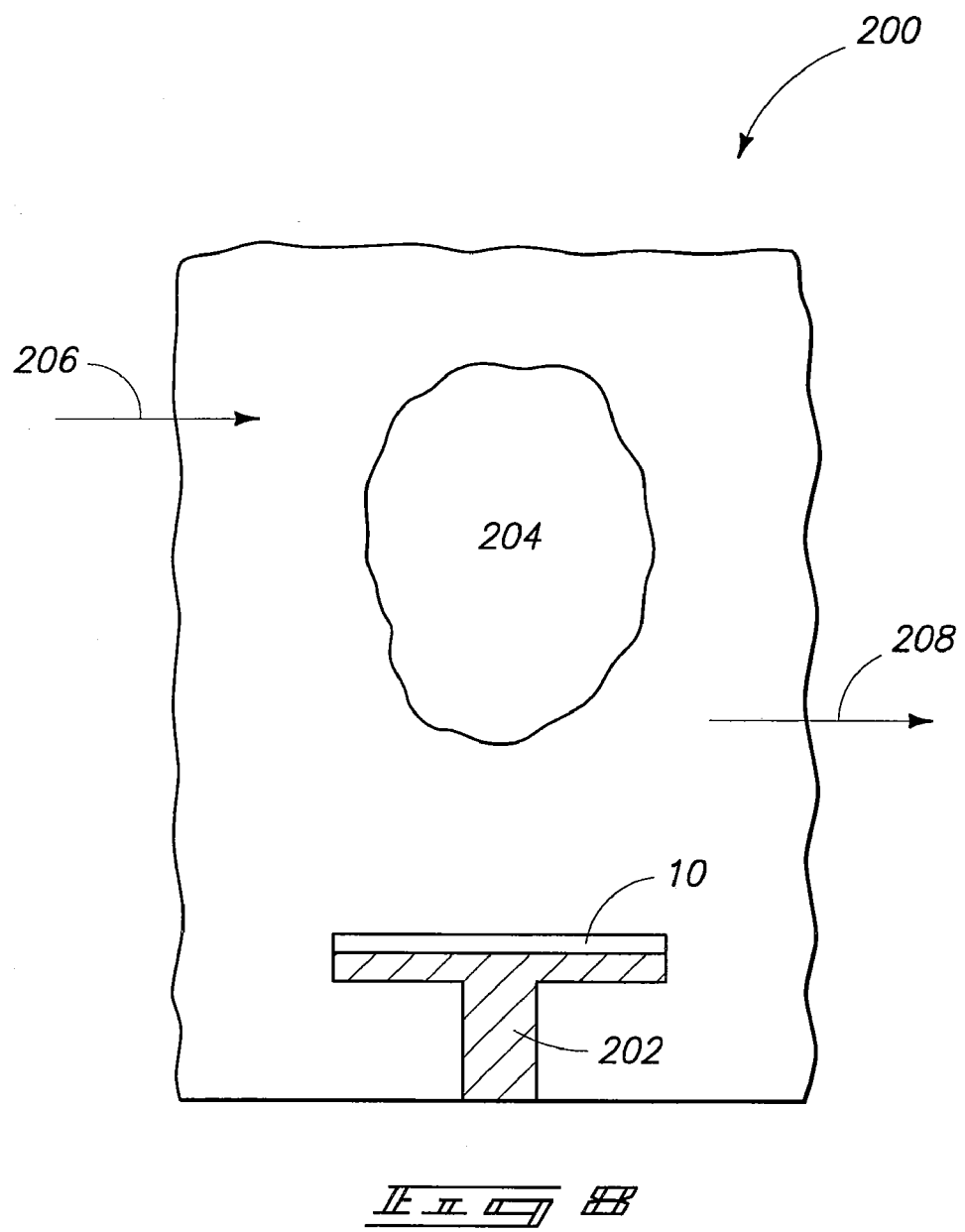
FIG. 8 diagrammatically illustrates a portion of an etching chamber which may be utilized in an embodiment of the invention.

The etching may be conducted in an etching chamber, such as the chamber 200 diagrammatically illustrated in FIG. 8. Such chamber has a substrate holder 202 provided therein which retains a semiconductor substrate 10. The chamber has a region above the substrate within which a plasma 204 is maintained. Etching components are flowed into the chamber as diagrammatically illustrated by arrow 206, and products and unreacted etching components are flowed out of the chamber as diagrammatically illustrated by arrow 208. There may be a flow of materials through an etching chamber during an etching process. The materials within the etching chamber during the etching process may be referred to as an etching ambient. The materials within the etching chamber may be in a gas or plasma state, and accordingly may be referred to as an etching fluid.

The etching ambient utilized during the etch through silicon oxide-containing material 50 of FIG. 5 may comprise at least about 75 volume percent helium. Additionally, the etching ambient may comprise $O_2$ and one or more fluorocarbons; with the fluorocarbons and $O_2$ being utilized for a chemical-based part of the etch. The fluorocarbons may include $C_4F_8$ and $C_4F_6$.

If the etching ambient comprises only helium, fluorocarbons and $O_2$, it is found that there may be poor selectivity of the etch for silicon oxide-containing material relative to masking material 52. This may be due to fluorine being released during the etching process and attacking the masking material. It is also found that inclusion of CO (carbon monoxide) within the etching ambient may improve the selectivity of the etch for the silicon oxide-containing material relative to the masking material. Such may be due to the CO scavenging released fluorine. Utilization of CO may be particularly useful in applications in which masking material 52 comprises carbon, such as when masking material 52 consists essentially of, or consists of amorphous carbon or transparent carbon. The CO may be provided within the etching ambient to a concentration of at least about 5 volume percent.

An embodiment of the etch utilized to etch through silicon oxide-containing material 50 utilizes flow of the following through a reaction chamber:
  from about 6 sccm to about 100 sccm of one or more fluorocarbons (which may be about 60 sccm $C_4F_8$ and about 2 sccm $C_4F_6$);
  from about 100 sccm to about 1500 sccm of helium (which may be about 1000 sccm He);
  from about 1 sccm to about 500 sccm of CO (which may be about 300 sccm CO); and
  from about 2 sccm to about 40 sccm of $O_2$ (which may be about 25 sccm $O_2$).

The etch may be conducted with a pressure of the ambient (in other words, a pressure within the reaction chamber) of from about 10 millitorr to about 30 millitorr (for instance, about 30 millitorr); a plasma power of from about 1500 watts to about 3000 watts, (for instance, about 2100 watts); and a substrate bias of from about 2000 watts to about 5000 watts, (for instance, about 3500 watts).

In some embodiments, the etching ambient may consist essentially of helium, one or more fluorocarbons, CO and $O_2$ for at least a portion of an etch. The helium, one or more fluorocarbons, CO and $O_2$ are the materials flowed into the chamber during the etch, but the composition of the etching ambient may change as products are released during the etching process. In some embodiments, the helium, one or more fluorocarbons, CO and $O_2$ are the only materials flowed into the chamber; and accordingly the etching materials flowed in the chamber may be considered to consist of the helium, one or more fluorocarbons, CO and $O_2$.

The silicon oxide-containing material 50 may, as discussed above with reference to FIG. 1, comprise doped silicon oxide-containing material (such as BPSG, PSG or FSG) and/or undoped silicon dioxide. In some embodiments, material 50 may consist of doped silicon oxide-containing material, and in other embodiments material 50 may consist of $SiO_2$. In yet other embodiments, material 50 may comprise a thick mass of doped silicon oxide-containing material over a layer consisting of $SiO_2$.

Although the etch of FIG. 5 is shown extending all the way to the source/drain regions, it is to be understood that in other embodiments conductive pedestals could be formed over the source/drain regions, and the etch could then be conducted to extend to upper surfaces of such conductive pedestals.

The openings formed within silicon oxide-containing material 50 may be high aspect ratio openings, and accordingly may have aspect ratios of at least 20:1, and in some embodiments may have aspect ratios of 24:1 or higher.

Figure 6:
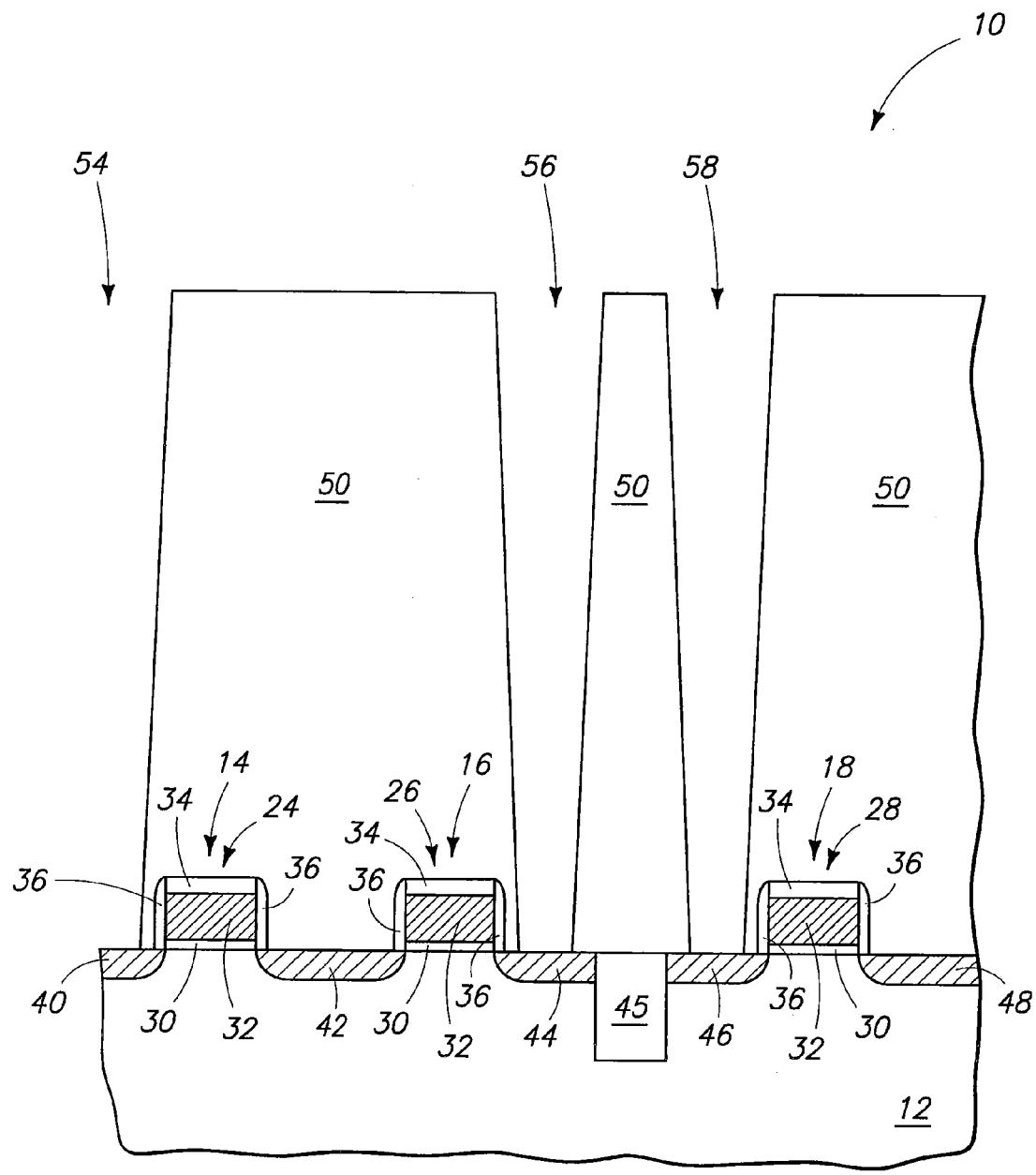

Referring to FIG. 6, masking material 52 is removed. Such removal may be accomplished with any suitable etch, or combination of etches, and may for example be accomplished with a dry strip process, such as a strip utilizing $O_2$.

Figure 7:
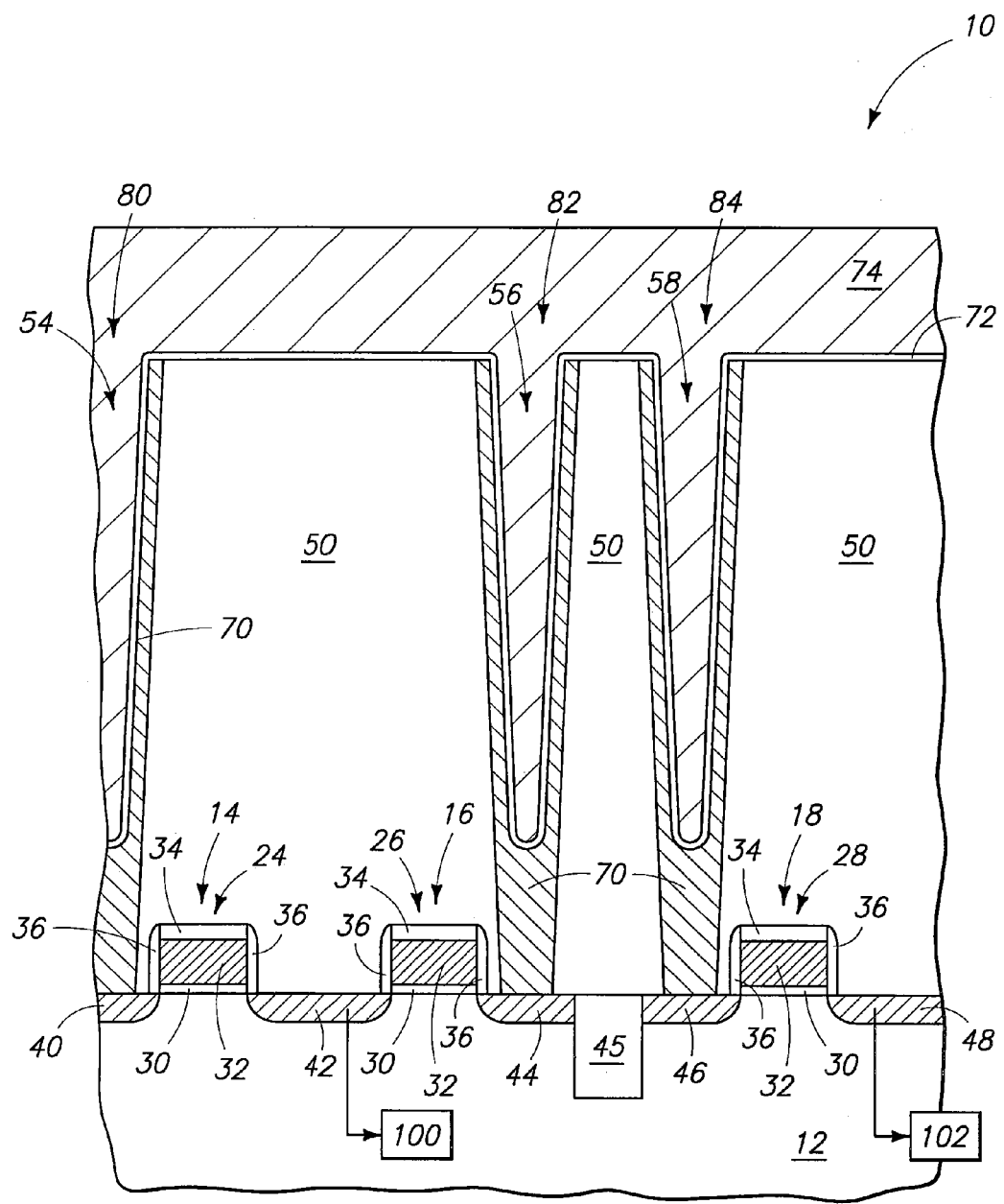

Referring to FIG. 7, the openings 54, 56 and 58 are utilized as containers of container capacitors. Specifically, first capacitor electrode material 70, dielectric material 72 and second capacitor electrode material 74 are formed within the openings to form container capacitors 80, 82 and 84. Such container capacitors are directly over source/drain regions 40, 44 and 46, respectively. In some embodiments, silicon oxide-containing material 50 may be at least about 1 micron thick, and accordingly the containers of the container capacitors may be at least about 1 micron deep. Accordingly, tall, thin capacitors may be formed within the high aspect ratio openings 54, 56 and 58. The problem of adjacent capacitors shorting to another may be avoided utilizing the etching conditions discussed above with reference to FIG. 5.

Capacitors 80, 82 and 84 may be incorporated into a DRAM array. Specifically, shared source/drain regions 42 and 48 may be connected to bitlines 100 and 102 (diagrammatically illustrated in FIG. 7), and transistor gates 24, 26 and 28 may be comprised by wordlines. Each of the individual transistors 14, 16 and 18 may be considered to comprise paired source/drain regions (for instance, transistor 14 comprises paired source/drain regions 40 and 42). Further, each of the individual transistors has one of the paired source/drain regions electrically coupled with a capacitor (for instance, capacitor 80 is electrically coupled with source/drain region 40), and has the other of the paired source/drain regions electrically coupled with a bitline (for instance, source/drain region 42 is electrically coupled with bitline 100).

In compliance with the statute, the subject matter disclosed herein has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a capacitor, comprising:
    forming silicon oxide-containing material over a semiconductor base;
    utilizing etching materials and a patterned mask to form an opening that extends through the silicon oxide-containing material to the semiconductor base, the etching materials consisting of helium, carbon monoxide, oxygen, one or more fluorocarbons, and $O_2$; the opening being wider at a top of the silicon oxide-containing material and narrower at a bottom of the silicon oxide-containing material, and having sloped sidewalls that extend from the bottom of the silicon oxide-containing material to the top of the silicon oxide-containing material;
    forming first capacitor electrode material within the opening;
    forming dielectric material within the opening and over the first capacitor electrode material; and
    forming second capacitor electrode material within the opening and over the dielectric material; the first and second capacitor electrode materials, together with the dielectric material, forming a capacitor within the opening.

2. The method of claim 1 wherein the patterned mask comprises transparent carbon.

3. A method of forming a plurality of capacitors, comprising:
    providing a semiconductor construction within an etching chamber, the semiconductor construction comprising conductive regions;
    forming silicon oxide-containing material over the conductive regions;
    forming a patterned carbon-containing mask over the silicon oxide-containing material; the patterned carbon-containing mask having a plurality of openings extending therethrough and comprising transparent carbon;
    flowing etching materials into the chamber, the etching materials consisting of helium, carbon monoxide, oxygen, one or more fluorocarbons, and $O_2$;
    utilizing the etching materials to extend the openings into the silicon oxide-containing material to form containers in the silicon oxide-containing material; the containers being directly over the conductive regions; and
    forming first capacitor electrode material and dielectric material within the containers, and forming second capacitor electrode material spaced from the first capacitor electrode material by the dielectric material; the first and second capacitor electrode materials, together with the dielectric material, forming a plurality of capacitors within the plurality of the openings; the capacitors being electrically coupled with the conductive regions.

4. The method of claim 3 wherein the silicon oxide-containing material comprises doped silicon oxide.

5. The method of claim 3 wherein the silicon oxide-containing material consists of doped silicon oxide.

6. The method of claim 3 wherein the flowing of the etching materials into the chamber comprises flow rates of:
    from about 6 sccm to about 100 sccm of the one or more fluorocarbons;
    from about 100 sccm to about 1500 sccm of the helium; and
    from about 1 sccm to about 500 sccm of the carbon monoxide.

7. The method of claim 6 further comprising providing the $O_2$ at a flow rate of from about 2 sccm to about 40 sccm.

8. The method of claim 3 further comprising formulating the one or more fluorocarbons to consist of $C_4F_8$ and $C_4F_6$.

* * * * *

UNITED STATES PATENT AND TRADEMARK OFFICE
CERTIFICATE OF CORRECTION

PATENT NO.         : 8,309,413 B2                                            Page 1 of 1
APPLICATION NO.    : 13/225034
DATED              : November 13, 2012
INVENTOR(S)        : Russell A. Benson It is certified that error appears in the above-identified patent and that said Letters Patent is hereby corrected as shown below:

In column 1, lines 6-7, delete "Dec. 4, 2009," and insert -- Aug. 20, 2008, --, therefor.

Signed and Sealed this
Twenty-second Day of January, 2013

David J. Kappos
*Director of the United States Patent and Trademark Office*